(12) United States Patent
Liu et al.

(10) Patent No.: US 10,768,676 B2
(45) Date of Patent: Sep. 8, 2020

(54) DOCKING SYSTEMS AND METHODS FOR ELECTRONIC DEVICES

(71) Applicant: Intel Corporation, Santa Clara, CA (US)

(72) Inventors: Baomin Liu, Austin, TX (US); Eduardo Escamilla, Round Rock, TX (US); James Utz, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 69 days.

(21) Appl. No.: 15/698,183

(22) Filed: Sep. 7, 2017

(65) Prior Publication Data

US 2019/0072999 A1 Mar. 7, 2019

(51) Int. Cl.
*G06F 1/16* (2006.01)
*G06F 1/20* (2006.01)
*H05K 7/20* (2006.01)

(52) U.S. Cl.
CPC ............ *G06F 1/203* (2013.01); *G06F 1/1615* (2013.01); *G06F 1/1632* (2013.01); *G06F 1/1641* (2013.01); *H05K 7/20145* (2013.01); *H05K 7/20209* (2013.01)

(58) Field of Classification Search
CPC ........... G06F 1/181–182; G06F 1/1632; G06F 1/203; G06F 1/20; G06F 1/1615; G06F 1/1641; H05K 7/20218–20381; H05K 7/20409–20418; H05K 7/20009–202; H05K 7/20136–20145; H05K 7/20163; H05K 7/20209; H01L 23/367–3677; H01L 23/473; H01L 23/46–467
USPC ...... 361/676–678, 679.46–679.54, 688–723; 165/80.1–80.5, 104.33, 185, 80.1–80.3; 174/15.1–15.3, 16.1–16.3, 547, 548, 252; 257/712–722, E23.088; 24/453, 458–459; 454/184; 312/236
See application file for complete search history.

(56) References Cited

U.S. PATENT DOCUMENTS

| 5,872,557 A * | 2/1999 | Wiemer | A45C 7/0045 345/156 |
| 5,959,836 A * | 9/1999 | Bhatia | G06F 1/203 361/679.41 |
| 6,094,347 A * | 7/2000 | Bhatia | G06F 1/203 165/104.33 |

(Continued)

OTHER PUBLICATIONS

Fenix, Kevin, "SVALT D2 High Performance Cooling Dock Press Release", fanboynation, (Oct. 25, 2016), 3 pgs.

*Primary Examiner* — Zachary Pape
(74) *Attorney, Agent, or Firm* — Schwegman Lundberg & Woessner, P.A.

(57) ABSTRACT

Illustrative examples include a docking system for a foldable electronic device such as a 2-in-1 convertible computer. The docking system may include a housing having an engagement surface to interface with a portion of the foldable electronic device when the foldable electronic device is operably engaged with the docking system. The engagement surface may include a vent opening arranged to direct airflow in between a first portion and a second portion of the plurality of portions, and a separator to maintain separation between the first portion and the second portion when the foldable electronic device is operably engaged with the engagement surface. A blower coupled to the housing may supply airflow through the vent opening.

27 Claims, 15 Drawing Sheets

(56) References Cited

U.S. PATENT DOCUMENTS

| | | | | |
|---|---|---|---|---|
| 6,181,553 B1* | 1/2001 | Cipolla | G06F 1/1632 | 165/104.33 |
| 6,243,261 B1* | 6/2001 | Janik | G06F 1/1615 | 361/679.46 |
| 6,266,241 B1* | 7/2001 | Van Brocklin | G06F 1/1616 | 361/679.46 |
| 6,459,574 B1* | 10/2002 | Ghosh | G06F 1/1632 | 165/80.4 |
| 6,522,535 B1* | 2/2003 | Helot | G06F 1/1632 | 165/104.34 |
| 6,556,435 B1* | 4/2003 | Helot | G06F 1/1632 | 361/679.09 |
| 6,795,311 B2* | 9/2004 | Pokharna | G06F 1/1632 | 361/679.54 |
| 6,837,058 B1 | 1/2005 | McEuen et al. | | |
| 6,842,338 B2* | 1/2005 | Iredale | G06F 1/1616 | 248/551 |
| 7,301,767 B2* | 11/2007 | Takenoshita | G06F 1/203 | 165/80.3 |
| 7,515,408 B2* | 4/2009 | Bakker | G06F 1/1632 | 361/679.55 |
| 7,548,427 B2* | 6/2009 | Mongia | G06F 1/1632 | 165/104.26 |
| 8,926,414 B1* | 1/2015 | Kirkpatrick | H05K 7/20136 | 361/679.41 |
| 9,143,719 B2* | 9/2015 | Tamura | G06F 1/1632 | |
| 9,226,427 B2 | 12/2015 | Liu et al. | | |
| 9,436,238 B1* | 9/2016 | Douthit | H05K 7/20127 | |
| 2001/0033475 A1* | 10/2001 | Lillios | G06F 1/1632 | 361/679.54 |
| 2002/0018335 A1* | 2/2002 | Koizumi | G06F 1/1632 | 361/679.47 |
| 2004/0047124 A1* | 3/2004 | Hsieh | G06F 1/203 | 361/679.47 |
| 2004/0223299 A1 | 11/2004 | Ghosh | | |
| 2004/0261422 A1* | 12/2004 | McEuen | G06F 1/1626 | 62/3.2 |
| 2005/0013102 A1* | 1/2005 | Poulsen | A47B 21/0314 | 361/679.55 |
| 2005/0161197 A1* | 7/2005 | Rapaich | G06F 1/1632 | 165/80.4 |
| 2005/0162824 A1* | 7/2005 | Thompson | G06F 1/1632 | 361/679.41 |
| 2009/0086424 A1* | 4/2009 | Jette | G06F 1/1601 | 361/679.55 |
| 2010/0053877 A1* | 3/2010 | Hsu | G06F 1/1616 | 361/679.27 |
| 2010/0067181 A1* | 3/2010 | Bair | G06F 1/1616 | 361/679.3 |
| 2010/0079940 A1* | 4/2010 | Mongia | G06F 1/20 | 361/679.49 |
| 2012/0127663 A1* | 5/2012 | Mochizuki | G06F 1/1658 | 361/692 |
| 2012/0327581 A1* | 12/2012 | Pais | G06F 1/1632 | 361/679.26 |
| 2013/0058065 A1* | 3/2013 | Minaguchi | H04N 5/64 | 361/807 |
| 2013/0335914 A1* | 12/2013 | Lee | G06F 1/1632 | 361/679.41 |
| 2014/0043750 A1* | 2/2014 | Calderone | G06F 1/1632 | 361/679.41 |
| 2014/0092542 A1* | 4/2014 | Nishi | G06F 1/1616 | 361/679.06 |
| 2015/0116927 A1* | 4/2015 | Robinson | H05K 5/0208 | 361/679.43 |
| 2015/0124398 A1* | 5/2015 | Kirkpatrick | H05K 7/20136 | 361/679.48 |
| 2016/0254954 A1* | 9/2016 | King | G06F 1/1632 | 726/1 |
| 2017/0273214 A1* | 9/2017 | Casparian | G06F 1/203 | |

* cited by examiner

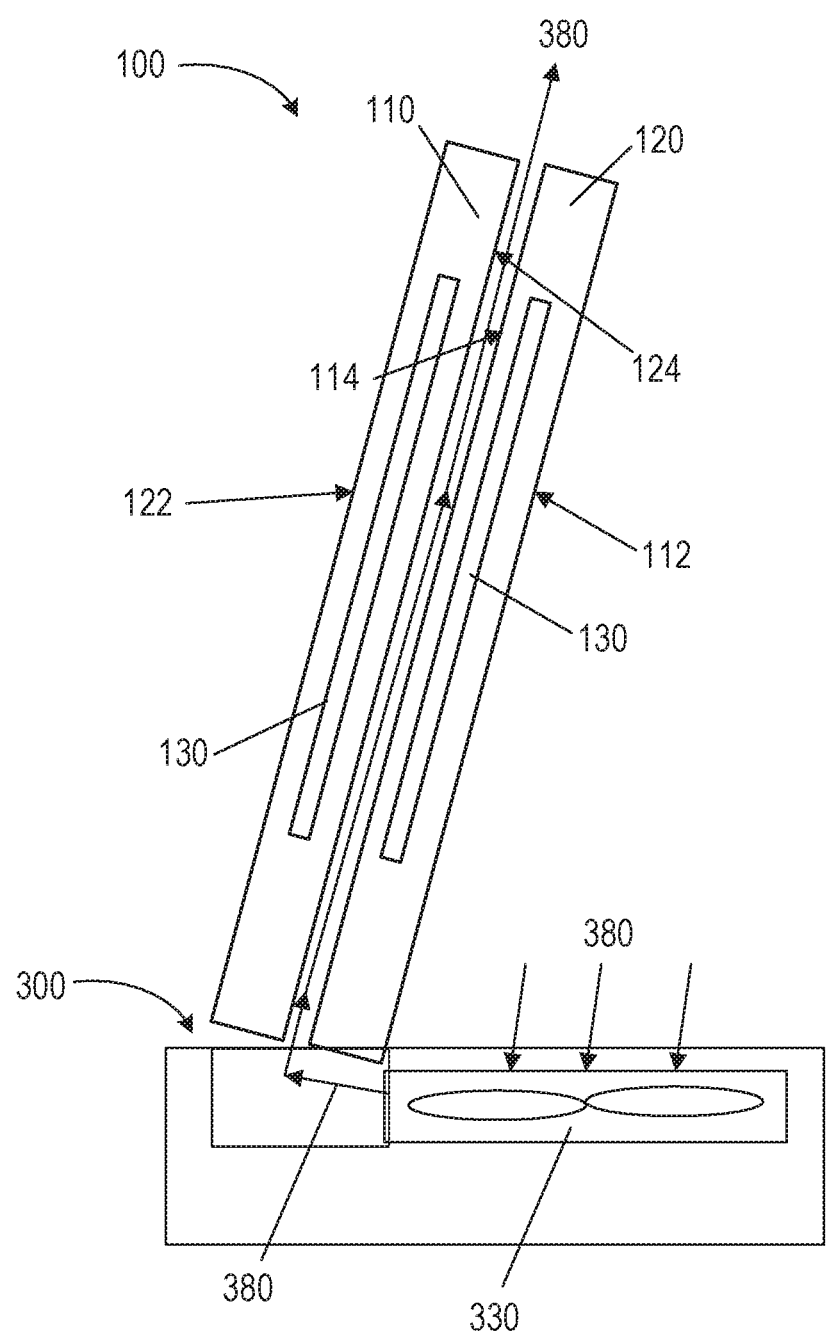

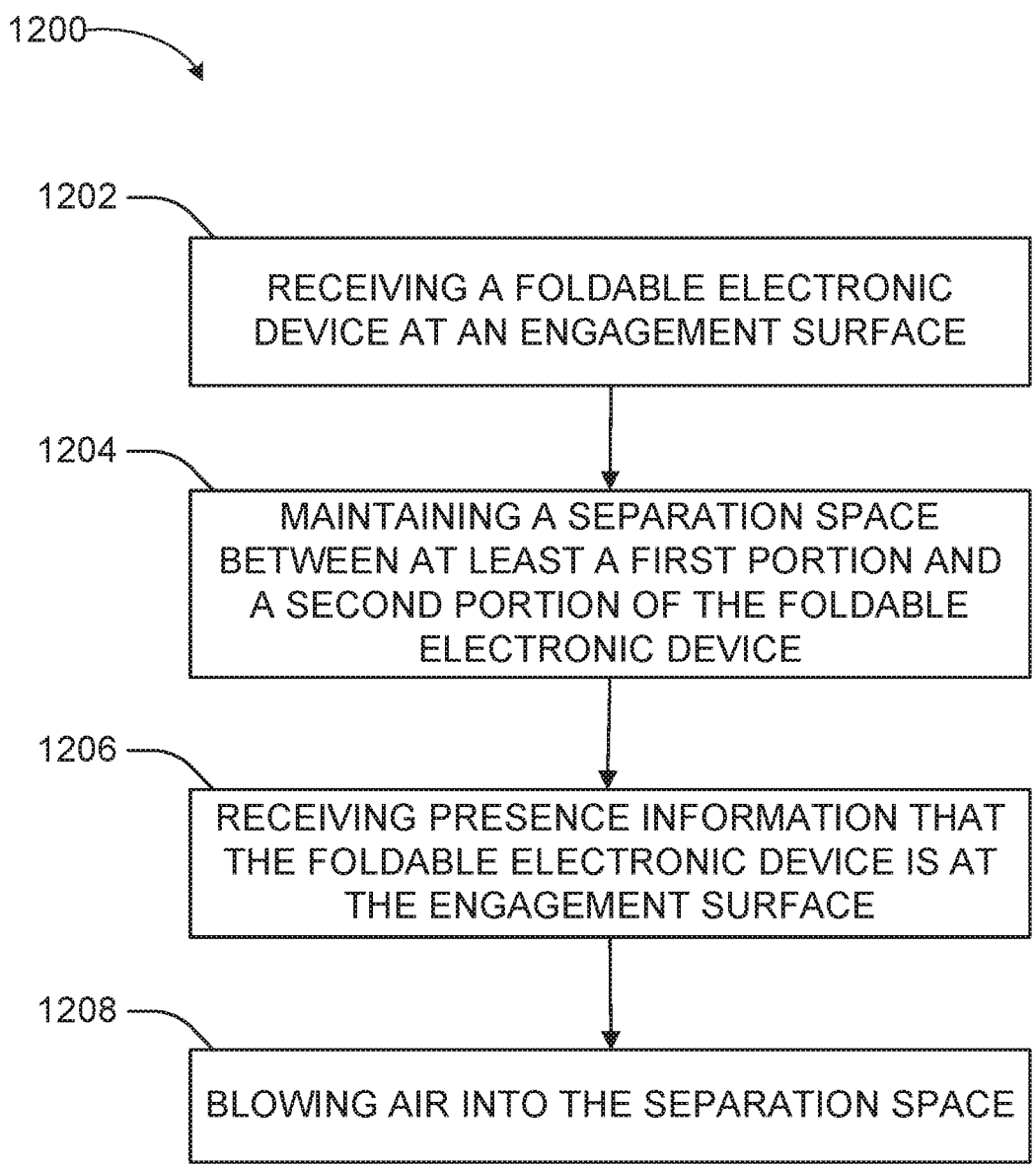

DOCKING SYSTEMS AND METHODS FOR ELECTRONIC DEVICES

TECHNICAL FIELD

This document pertains generally, but not by way of limitation, to docking systems that support foldable electronic devices, such as 2-in-1 convertible computers, single flexible screen devices, or folding multi-screen computers. More particularly, this disclosure may be applied to docking systems that facilitate cooling.

BACKGROUND

Laptops provide convenient portable computing, however, when a user attempts to use a laptop in their office, such as in conjunction with an external monitor, mouse and keyboard, the laptop may not cool as efficiently as a desktop computer. This may lead to poorer performance in a laptop than in a desktop.

Increased cooling is especially helpful, for example, when editing photos and videos, playing video games, rendering models, or running other high-demand applications.

Some docking systems use fans to cool a laptop that is docked. Such docking systems are designed to cool the laptop when the laptop is docked and oriented in the fully closed mode. These docking systems provide additional cooling over the fan provided in the laptop alone to improve performance.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various examples discussed in the present document.

FIG. 2 also shows the airflow delivered by the traditional laptop-style docking system.

FIG. 3 is a general side view schematic showing an example orientation of a foldable electronic device and airflow delivered from an illustrative docking system to the foldable electronic device, in accordance with at least one example.

FIG. 12 is a flow chart illustrating a method of cooling a foldable electronic device to a docking system, such as the docking systems of FIGS. 3, 4A-4F, 5, 6, 7A-7B and 8-11.

DETAILED DESCRIPTION

As previously described, laptops provide convenient portable computing, however, when a user attempts to use a laptop in their office, such as in conjunction with an external monitor, mouse and keyboard, the laptop may not cool as efficiently as a desktop computer. This may lead to poorer performance in a laptop than in a desktop.

Some docking systems use fans to cool a laptop that is docked. Such docking systems are designed to cool the laptop when the laptop is docked and oriented in the fully closed mode. These docking systems provide additional cooling over the fan provided in the laptop alone to improve performance.

Figure 2:
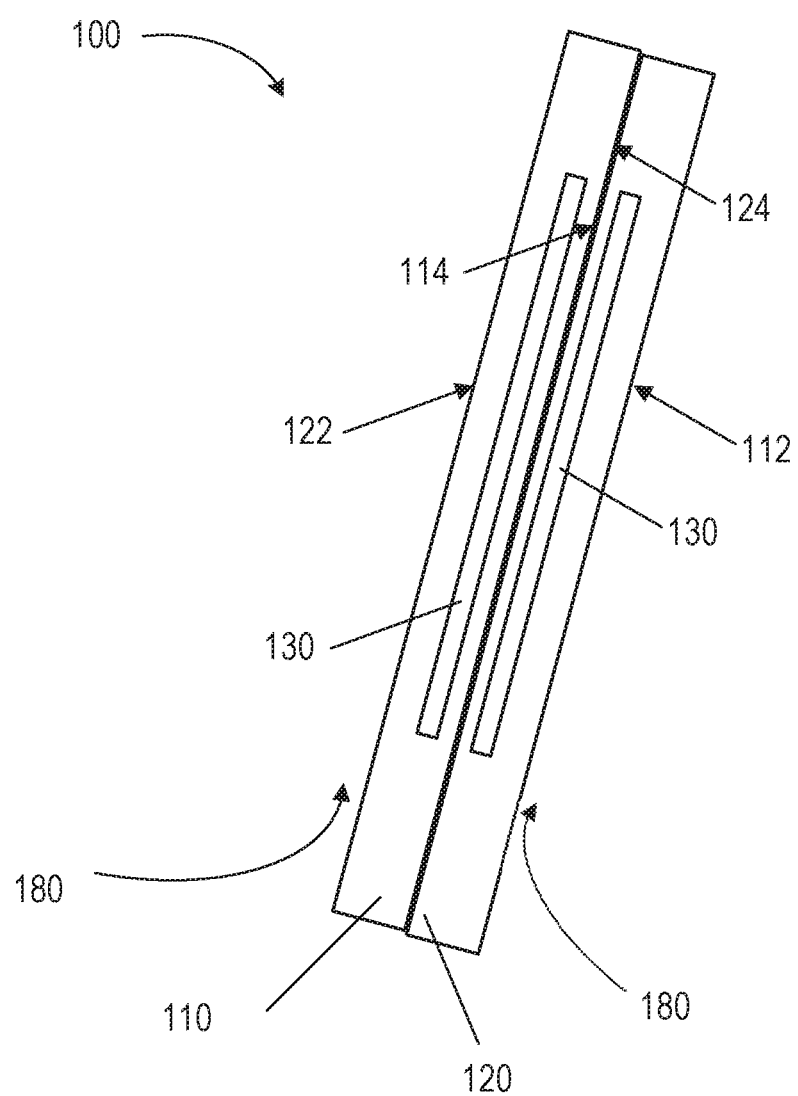
FIG. 2 is a side view schematic showing an example of the foldable electronic device of FIGS. 1A and 1B if it was docked in a traditional laptop-style docking system with the foldable electronic device in the fully open tablet mode of FIG. 1B.

In addition to laptops for portable computing, foldable electronic devices such as 2-in-1 convertible computers have been introduced more recently. One difference between some laptops and some 2-in-1 convertible computers is that, while laptops generally have a fan, 2-in-1 convertible computers often do not. Instead, 2-in-1 computers tend to rely entirely on free convection for cooling. A challenge of cooling some foldable electronic devices, and 2-in-1 convertible computers in particular, is the absence of a blower (e.g., fan, compressor or other airflow providing device) in these foldable electronic devices; instead, these devices tend to rely entirely on free convection for cooling. As shown in FIG. 2, if a 2-in-1 convertible computer is docked in a traditional laptop type docking system in the fully open tablet mode (e.g., 360° open), the electrical components that benefit the most from cooling may end up arranged such that they are stuck in-between the two halves (e.g. portions, displays) of the computer resulting the lowest level of cooling.

Figure 1A:
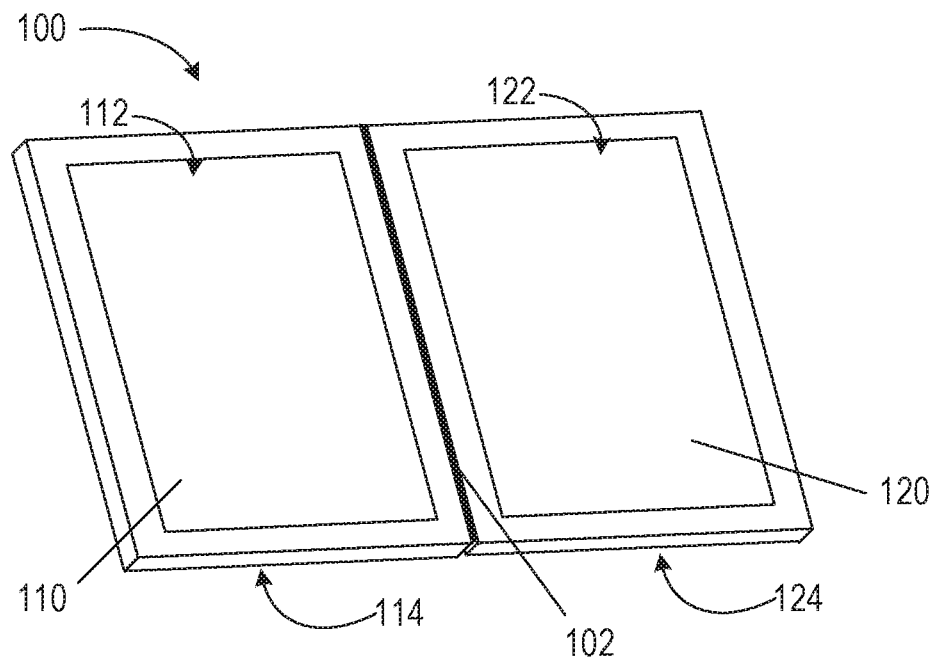
FIG. 1A is a perspective view of an example of a foldable electronic device that may be used with docking systems disclosed herein. The foldable electronic device is shown as a 2-in 1 convertible computer depicted in a 180 degree open mode.
Figure 1B:
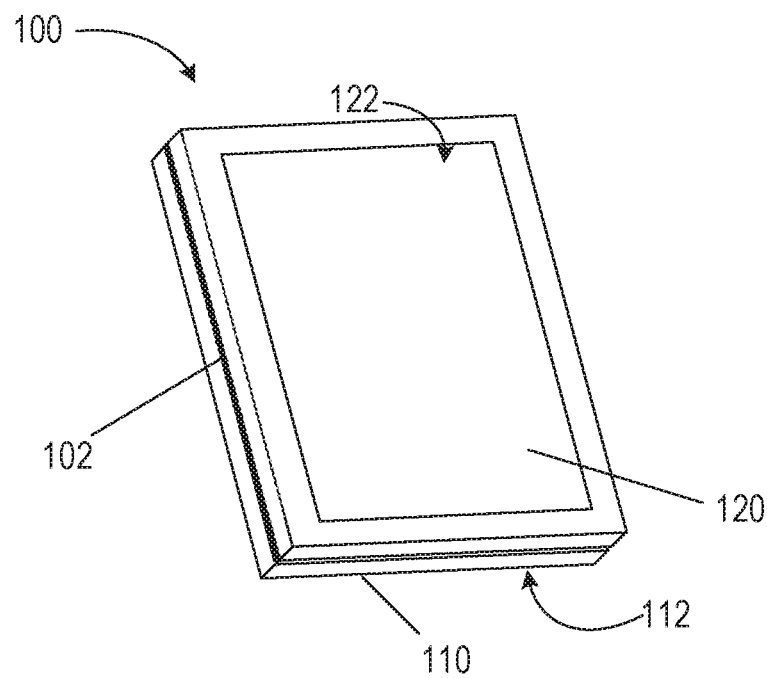
FIG. 1B is a perspective view of the foldable electronic device of FIG. 1A that may be used with the docking systems disclosed herein. The foldable electronic device is depicted in a 360 degree open mode (e.g., fully open, tablet mode).

FIG. 1A is a perspective view of an example of 2-in-1 computer (e.g., a foldable electronic device 100) that may be used with docking systems disclosed herein. The foldable electronic device 100 may include a plurality of portions that are foldable (e.g., hingeable, bendable) with respect to each other. As shown in FIG. 1A the plurality of portions include a first portion 110 and a second portion 120 coupled to one another at a fold 102. The foldable electronic device 100 is depicted in a 180 degree open mode. FIG. 1B is a perspective view of the foldable electronic device 100 of FIG. 1A but oriented in a 360 degree fully open tablet mode. In the fully open tablet mode, display surfaces (e.g., screens) 112, 122 may both face outward, sandwiching the electronics and non-display surfaces 114, 124 therebetween. This arrangement makes the fully open tablet mode the most difficult to cool.

FIG. 2 is a side view schematic showing an example of the airflow 180 delivered to the foldable electronic device 100 of FIGS. 1A and 1B when positioned on a traditional laptop-style docking system with the foldable electronic device 100 in the fully open tablet mode of FIG. 1B. Conventional docking systems fail to direct airflow to the areas of some foldable electronic devices, such as a 2-in-1 convertible computers, where cooling is most useful. This is particularly true when the foldable electronic device 100 is positioned on a docking system in the fully open tablet mode (FIG. 1B).

As shown in FIG. 2, the airflow 180 delivered by a traditional laptop style docking system, when used with a 2-in-1 convertible computer in the fully open table mode, directs the airflow along the display surfaces 112, 122. However, when these foldable electronic devices 100 are in the fully open tablet mode, the hot electrical components 130 are stuck in-between the first and second portions 110, 120 of the foldable electronic device resulting in the poorest cooling, which often results in low performance. The lack of a gap between the first portion 110 and the second portion 120 of the foldable electronic device 100 results in inefficient cooling with only the outside (e.g., display surfaces 112, 122) accessible to the cooling airflow 180. In conventional docking systems the surfaces and components that benefit the most from cooling do not receive the airflow 180.

Example docking systems herein provide improved performance for foldable electronic devices. The docking systems enable foldable electronic devices to have improved cooling, allowing them to perform more like a personal computer (PC) that has a fan, even when the foldable electronic device is docked in the fully open tablet mode (FIG. 1B). The docking systems and methods may include an engagement surface having a separator arranged to increase airflow to portions of the foldable electronic device 100 that need cooling the most. The advantages of the improved docking systems and methods may include: better performance of the foldable electronic device, improved durability of the electrical components 130 and the ability to use less expensive processors.

While the examples described herein generally discuss foldable electronic devices such as 2-in-1 convertible computers, the same concepts may also be applied to any other computer such as: tri-fold type computers, laptops, mobile devices, tablets, or any other foldable or bendable electronic device having any number of hinges, folds, bends, portions, cases or covers.

As used herein "air" may be atmospheric air, but is not limited as such. Air may include any suitable fluid including an inert gas, any other gas or combination of gases. In addition, the air may be at room temperature or modified to another temperature, such as by cooling of the air.

FIG. 3 is a general side view schematic showing an example of the foldable electronic device 100 of FIGS. 1A and 1B positioned proximate to a docking system 300. The foldable electronic device 100 may include a plurality of portions that are foldable with respect to each other (e.g., portions 110 and 120). The portions may have display or non-display surfaces.

As shown, the foldable electronic device 100 may include a first portion 110 and a second portion 120. Another example foldable electronic device (e.g., a tri-fold type is described below with reference to FIG. 8), however, the docking systems described herein may be used with the foldable electronic device of FIG. 8, as well as any other suitable foldable electronic device. The foldable electronic device of FIGS. 1A and 1B is provided merely as one example.

FIG. 3 also shows the general airflow 180 relationship provided to a foldable electronic device 100 when used with illustrative docking systems, in accordance with various examples. To solve the previous challenges with providing airflow 380 to the hottest electrical components 130 in a 2-in-1 convertible computer when oriented in the fully open tablet mode, example docking systems may include features to keep the foldable electronic device 100 open a small angle in order to create an airflow 380 path between the first and second portions 110, 120 so that the forced airflow 380 from a blower 330 may pass through vent opening (e.g., described in FIG. 4A-4F) and may get to the non-display surfaces 114, 124 to most efficiently cool the foldable electronic device 100.

Figure 4A:
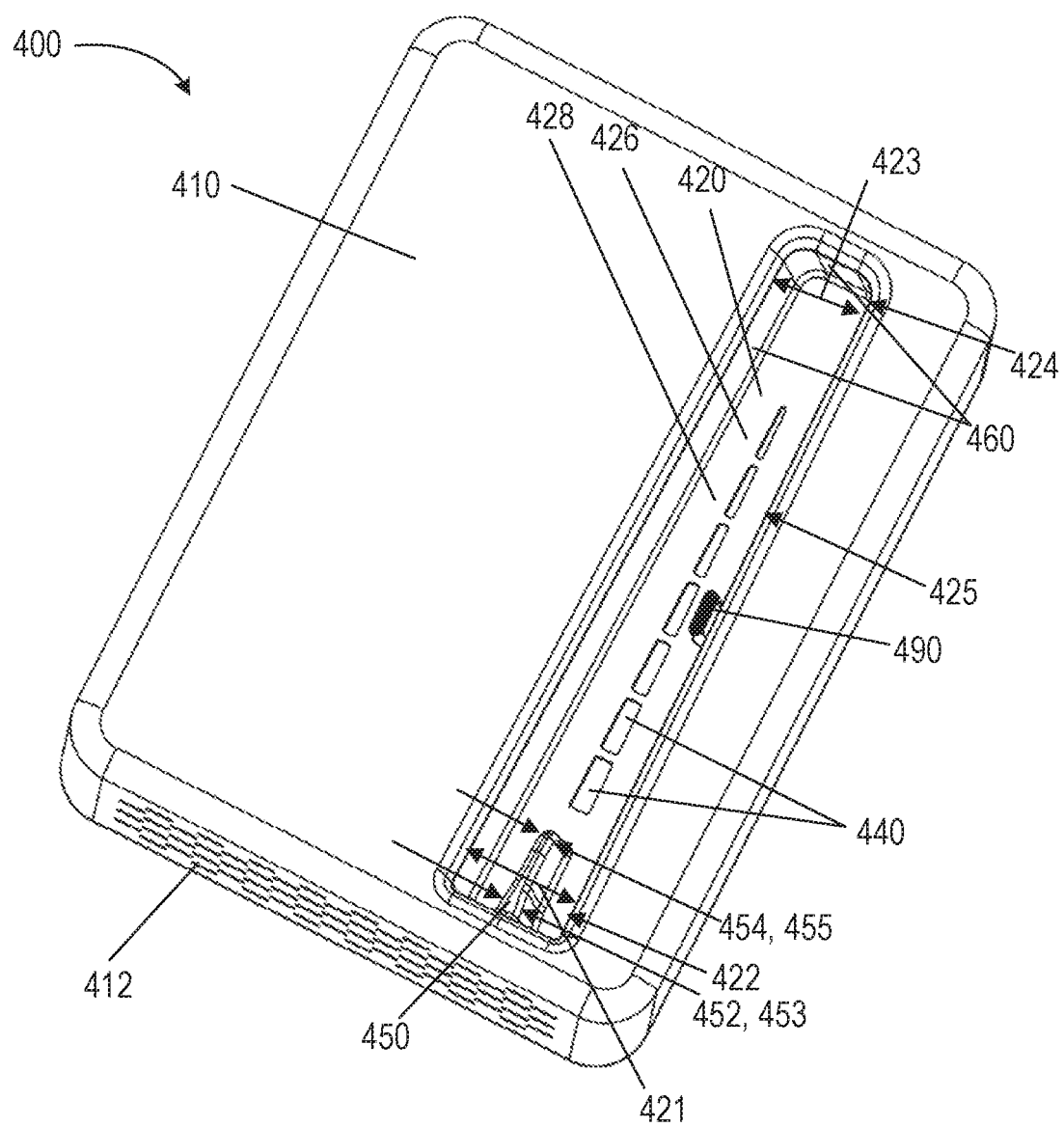
FIG. 4A is a perspective view of an illustrative docking system, in accordance with at least one example.
Figure 4B:
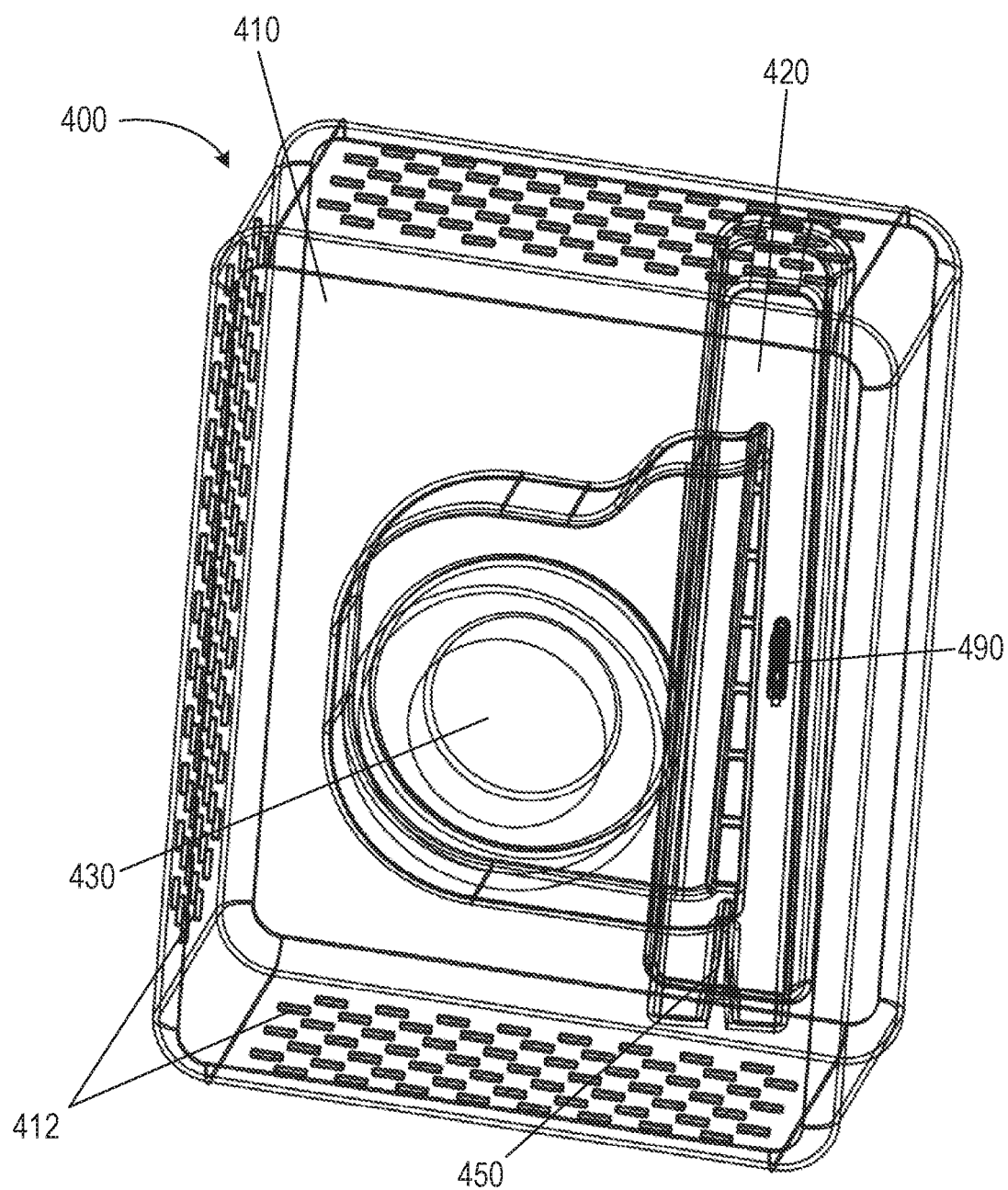
FIG. 4B is a perspective view of the illustrative docking system of FIG. 4A, showing an internal view of an illustrative blower arrangement.
Figure 4C:
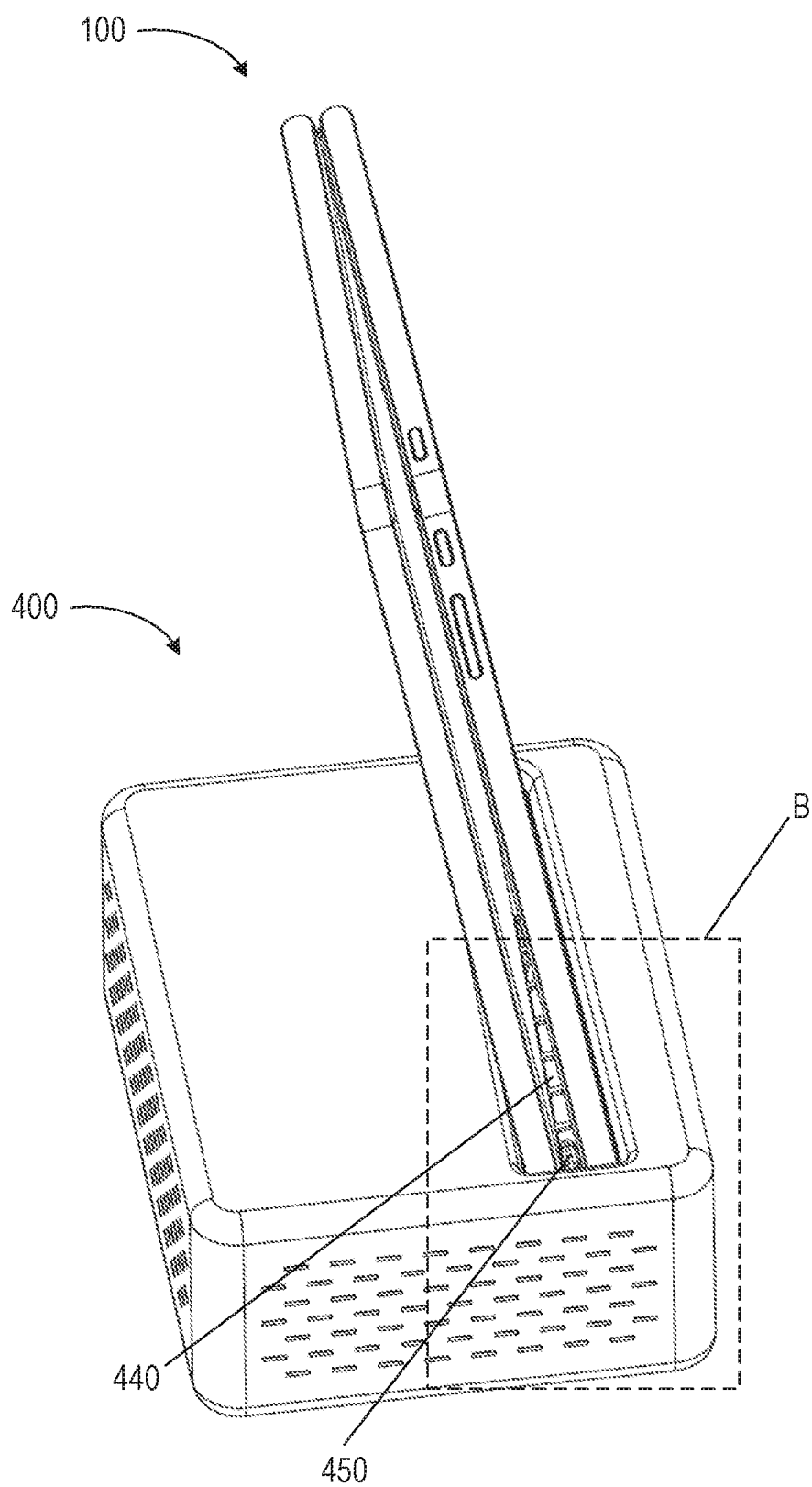
FIG. 4C is a side perspective view of the illustrative docking system of FIG. 4A, including an example foldable electronic device positioned at an engagement surface, in accordance with at least one example.

FIGS. 4A-4F shown an example of an illustrative docking system 400 based on the concept of FIG. 3. FIGS. 4A and 4B show the docking system 400 without the foldable electronic device 100, while FIGS. 4C-4F shown how the foldable electronic device may be positioned at an engagement surface 420 of the docking system 400.

To accomplish the desirable airflow depicted in FIG. 3, the docking system 400 may include a housing 410 having the engagement surface 420, a blower 430 (FIG. 4B), a vent opening 440, and a separator 450. The separator, 450 which will be described in further detail below, may be provided to maintain a gap 451 (FIG. 4D) between the first and second portions 110, 120 of the foldable electronic device 100 when the foldable electronic device 100 is engaged by (e.g., positioned proximate, received or supported by) the docking system 400. The separator 450 allows airflow 480 (e.g., FIG. 3) to pass between the first and second portions 110, 120 of the foldable electronic device 100, without any significant compromise in form and appearance to the user. In some examples, the engagement surface 420 may receive the foldable electronic device 100 in a mostly open tablet mode (e.g., less than 360 degrees), but not a fully open tablet mode (e.g., 360 degrees). In further detail, the engagement surface 420 may receive the foldable electronic device in a range between 330 and 359 degrees open. To give a more tablet-like appearance, a range between 340 and 359 degrees open may be used. In some examples, 355 degrees and 359 degrees open may represent a more preferred range.

The housing 410 may have an engagement surface 420 configured to engage (e.g., interface) with a portion of the foldable electronic device 100 when the foldable electronic device 100 is operably engaged with the docking system 400. As shown in FIG. 4A, the engagement surface 420 may extend from a first end portion 422 to a second end portion 424 and include a vent opening 440.

Figure 4D:
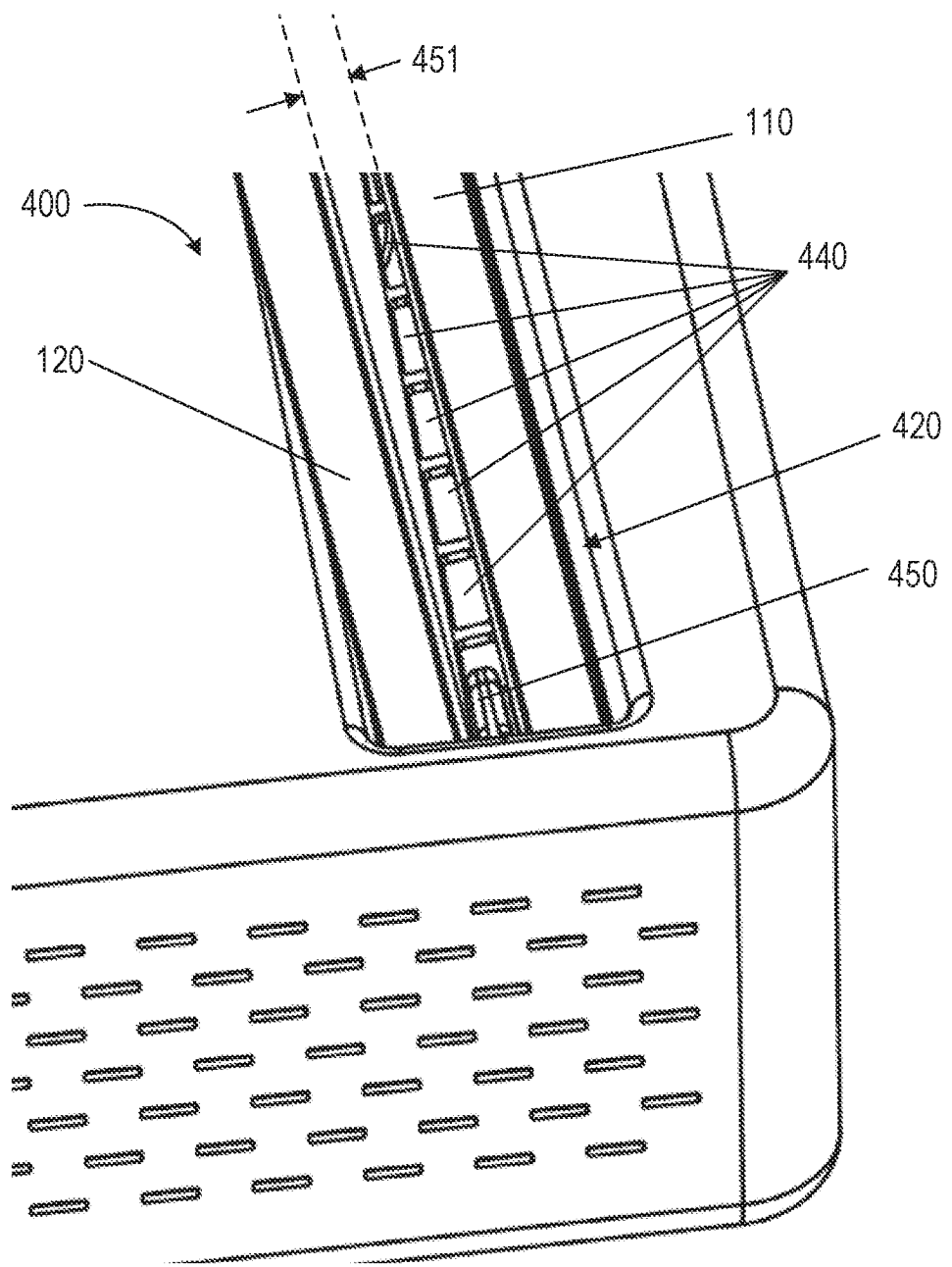
FIG. 4D is a close-up side perspective view of region B of the illustrative docking system and foldable electronic device of FIG. 4C, in accordance with at least one example.
Figure 4E:
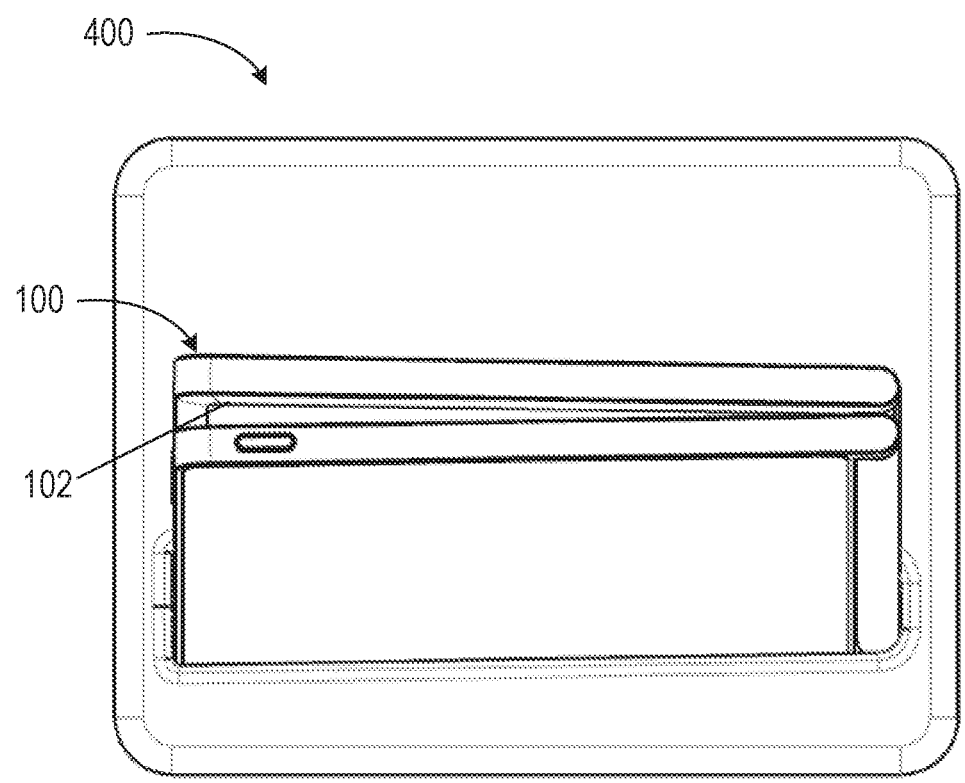
FIG. 4E is a top view of the illustrative docking system and foldable electronic device of FIG. 4C, in accordance with at least one example.
Figure 4F:
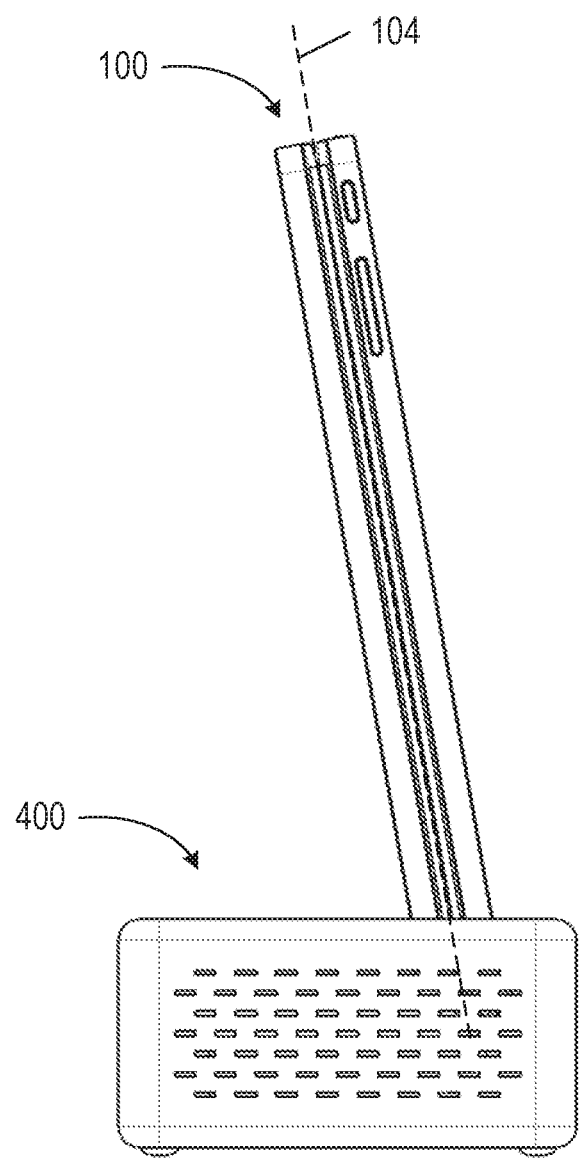
FIG. 4F is a side view of the illustrative docking system and foldable electronic device of FIG. 4C, in accordance with at least one example.

The blower 430 may be coupled to the housing 410 to supply airflow through the vent opening 440. The blower 430 may be any type of airflow providing device, such as a fan or compressor. The blower 430 may be arranged in any relationship to the vent opening 440 so that airflow is enabled to pass out of the vent openings 440 and into the gap 451 (FIG. 4D). For example, the blower 430 may be disposed in the housing 410, operably coupled to the housing 410 or coupled to the exterior of the housing 410, directly or indirectly. In the example of FIGS. 4A-4F, the airflow exiting the vent opening 440 may be directed generally parallel to an axis 104 of the foldable electronic device (FIG. 4F).

As shown in FIG. 4D, the separator 450 may maintain separation (e.g., gap 451) between the first portion 110 and the second portion 120 of the foldable electronic device 100 when the foldable electronic device 100 is operably engaged with the engagement surface 420, creating a separation space. In some examples, the separator 450 may be wedge-shaped. The wedge-shaped separator 450 may be arranged maintain the gap 451 in between the first and second portions 110, 120 that is sufficient to direct airflow in between a first portion and a second. The separator 450 may be provided in other forms besides a mechanical wedge-shaped separator 450. For example, the separator 450 may be provided as a magnet or other suitable means to provide separation between the first and second portions 110, 120 may be used. In addition, the separator 450, and other separators described herein do not have to be wedge-shaped.

The separator 450 may maintain a separation space between the first portion and the second portion of the foldable electronic device in a range between 1 degree and 30 degrees apart, or create a gap 451 of about 2 millimeters such as in a range between 1 millimeter and 50 millimeters (mm) apart, as well as other ranges described herein. To provide the beneficial cooling while maintaining the appearance of the device being in the tablet mode, a range of 1 degree and 5 degrees between the first portion 110 and the second portion 120, or 1 mm-5 mm gap 451 may be preferred. In some examples a preferred gap 451 at the non-folded end may be in a range between 1.5 mm and 5 mm, or a range between 1 degree and 20 degrees.

In the example of FIGS. 4A-4F, the separator 450 may be located proximate the first end portion 422 and the vent opening 440 may be located in between the first end portion 422 and the second end portion 424 of the engagement surface. For example, as shown in FIGS. 4C-4F, the engagement surface 420 and the separator 450 are arranged to support the foldable electronic device 100 in a standing book mode. The standing book mode may be described as being similar to a book that is stood up with front and back covers of the book angled slightly apart from one another. To accommodate the foldable electronic device 100 in the standing book mode, the engagement surface 420 may have a first width 421 at the first end portion 422 and a second width 423 at the second end portion 424, and the first width 421 may be larger than the second width 423. The first end portion 422 may be configured to support the non-folded end of the foldable electronic device 100 and maintain the gap (FIG. 4D, 451) between the first and second portions 110, 120 of the foldable electronic device 100. The second end portion 424 may be configured to support the folded end of the foldable electronic device 100.

In the example of FIGS. 4A-4F, the engagement surface 420 may include a recess 426 to accept insertion of at least a portion of the foldable electronic device 100. The separator 450 may be located in the recess 426 of the engagement surface 420. This is illustrated in FIG. 4A and the close-up view of the separator 450 maintaining a separation shown in FIG. 4D. In some examples, the separator 450 may have a first thickness 453 at a separator first end portion 452 and a second thickness 455 at a separator second end portion 454. In the example of FIGS. 4A-4F, the first thickness 453 is larger than the second thickness 455, with the separator first end portion 452 arranged proximate the first end portion 422 of the engagement surface 420.

To help direct airflow in between the first and second portions 110, 120 of the foldable electronic device, a seal 460 (e.g., a ring seal, a bead seal) may be included to reduce the airflow leakage between the foldable electronic device 100 and walls (e.g., defined around the perimeter 425) of the engagement surface 420. The seal 460 may be located along a perimeter 425 (FIG. 4A) of the engagement surface 420. The seal 460 may be arranged around at least a portion of the perimeter 425 or the entire perimeter 425. The seal 460 may be arranged to re-direct stray airflow exiting the vent opening 440 away from the perimeter 425 and into the separation space (e.g., gap 451) between the first and second portions 110, 120 of the foldable electronic device 100 when the foldable electronic device is operably engaged with the engagement surface 420. To provide a seal 460 with good function and fit, the seal 460 may be formed of an elastomeric material or any other suitable sealing or re-directing material.

In some examples, in addition to providing airflow for cooling, the docking system 400 may also provide charging or data transmission to and from the foldable electronic device 100. Although not required, as shown in FIGS. 4A and 4B, the docking system may include an electrical connector 490 to operably couple the foldable electronic device 100 to the docking system 400. The electrical connector 490 may enable charging of the foldable electronic device 100 or facilitate a transmission of data between the foldable electronic device 100 and the docking system 400, which may transmit the data to a computer or monitor, or any other electronic device that is also operably coupled to the docking system 400.

As shown in FIG. 4B, to provide for air intake into the blower 430, the housing may have intake openings 412 located on any surface of the housing 410, such as on the bottom, top or side walls of the housing. In the example of FIGS. 4A-F, the intake openings 412 are shown formed in the side walls (visible in FIGS. 4A-4D and 4F).

In an example method of airflow according to the example docking system of FIGS. 4A-F, thermal analysis for a 2-in-1 convertible computer having dual 8-inch displays and an Intel Core M processor was evaluated. Assuming a 2 mm gap for the airflow between the first portion and the second portion, airflow traveled through the separation space created by the separator 450, absorbed the heat and left the system out of a right side, a left side and a top side of the 2-in-1 computer. The results showed a surface temperature profile of the 2-in-1 convertible computer that was uniform and well within reasonable skin temperature specifications.

In the thermal analysis, the docking system design according to the example of FIGS. 4A-F used only 1.2 cubic feet per minute (CFM) to provide the necessary cooling, and the acoustic noise produced was only around 32 decibels (dBA). Comparatively, thermal analysis for a conventional docking system design resulted in a 3 CFM requirement to reach the same performance. A larger blower was used to meet the flow requirements and the acoustic noise was estimated at about 42 dBA. The docking system examples described herein are therefore much more efficient, quiet and compact than conventional docking systems.

Figure 5:
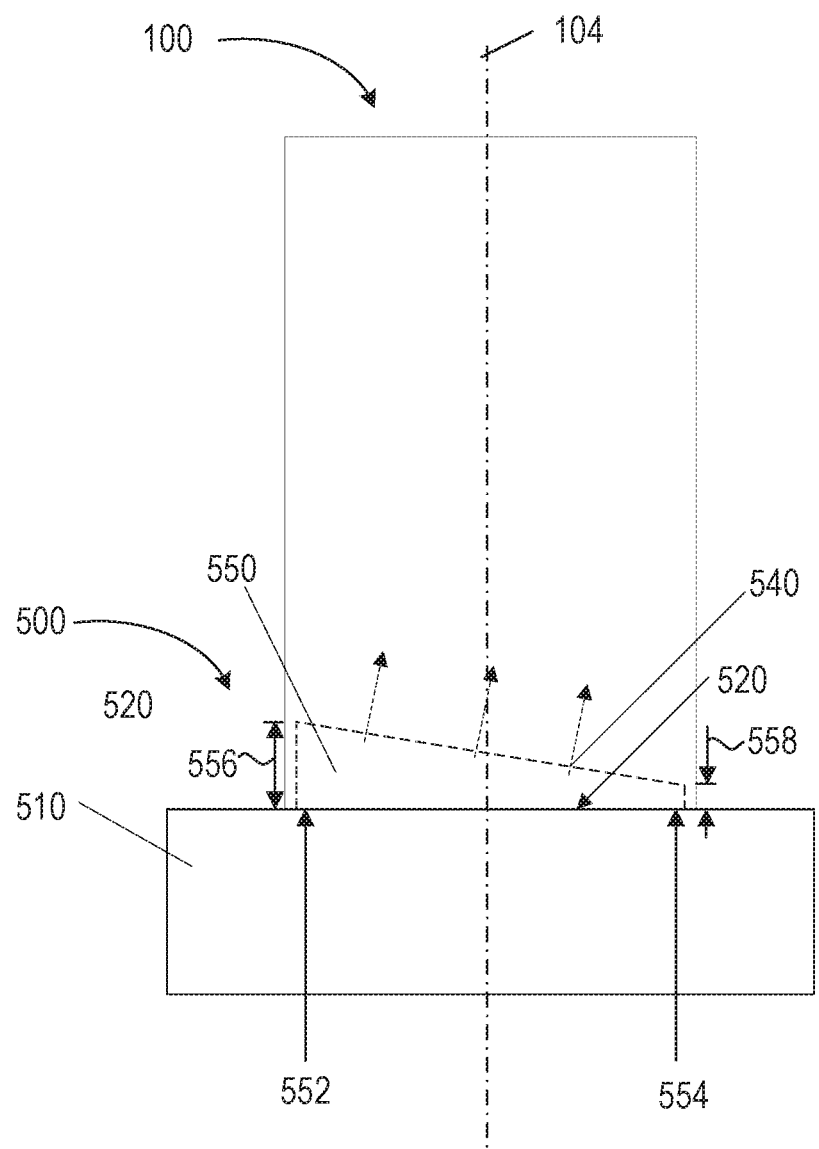
FIG. 5 is a side view schematic of another illustrative docking system, showing the foldable electronic device of FIGS. 1A and 1B operably engaged with the docking system, in accordance with at least one example.

In other examples, such as the example of FIG. 5, the airflow exiting the vent opening may be generally non-parallel to the foldable electronic device. FIG. 5 shows a side view schematic of another illustrative docking system, showing the foldable electronic device of FIGS. 1A and 1B operably engaged with the docking system, in accordance with at least one example.

Like the example of FIGS. 4A-4F, the example of FIG. 5 may include a housing, a blower 530, a vent opening 540 and a separator 550. The separator 550 of FIG. 5 may have a first height 556 at a first end portion 552 of the separator 550 and a second height 558 at a second end portion 554 of the separator 550. In the example of FIG. 5, the first height 556 and the second height 558 may be different. The first height 556 may be greater than the second height 558 as shown, or the second height 558 may be greater than the first height 556, depending on the desired airflow characteristics.

The vent opening 540 in the example of FIG. 5 may be formed into the geometry of the separator 550. However, in some examples, the vent opening 540 may not be part of the separator 550 but may be located proximate or adjacent to the separator 550, such as along at least a portion of a length of the separator 550. The arrangement of the vent opening 540 in the example of FIG. 5 may result in airflow from the vent opening 540 in a non-parallel direction to an axis 104 of the folding electronic device 100. One benefit of the non-parallel flow is to direct airflow up and away from the folded (e.g., hinged) end of the electronic device 100. Other examples similar to FIG. 5 may include a separator of varying height, like the example of FIG. 5, but may include vent openings that are shaped to extend through the separator parallel to the foldable electronic device such that the vent opening still provide airflow that is generally upward and parallel to the foldable electronic device, similar to the example of FIGS. 4A-4F.

Figure 6:
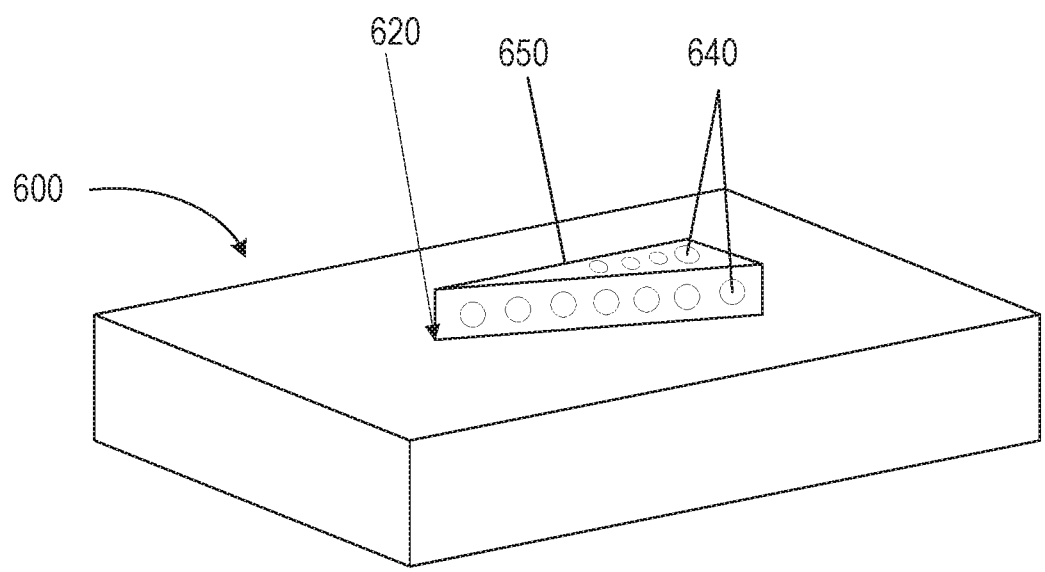
FIG. 6 is a perspective view schematic of another illustrative docking system, in accordance with at least one example.

FIG. 6 is a perspective view schematic of another illustrative docking system 600, in accordance with at least one example. In the example of FIG. 6, the docking system 600 may include a wedge-shaped separator 650 having vent openings 640 formed therein. The separator 650 may be arranged to extend along most of the length of the foldable electronic device (e.g., 100) that is to be used with the docking system 600. The separator 650 may be formed in a wedge shape, and as shown, the separator 650 may include one or more vent openings 640 formed in the top and or sides of the wedge-shaped separator 650 as shown. The separator 650 may include magnets or other features to stably support the foldable electronic device (e.g., 100) on the docking system 600.

Figure 7A:
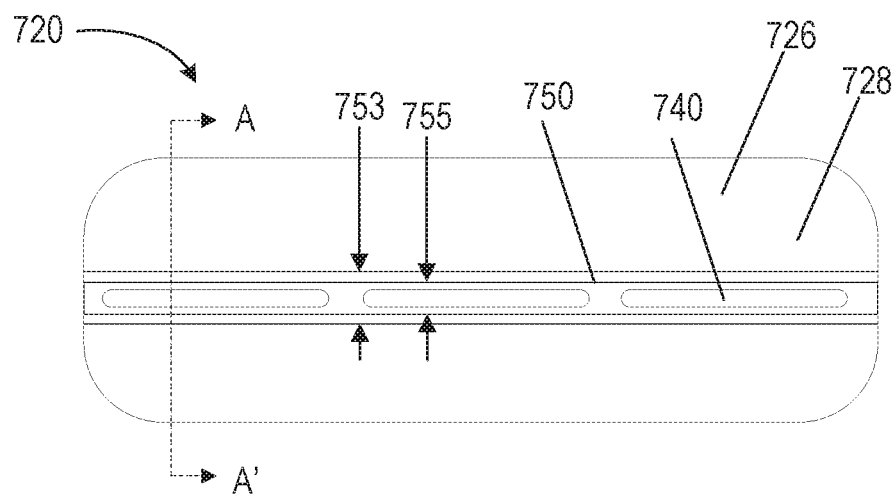
FIG. 7A is a top view schematic of another illustrative engagement surface, in accordance with at least one example.
Figure 7B:
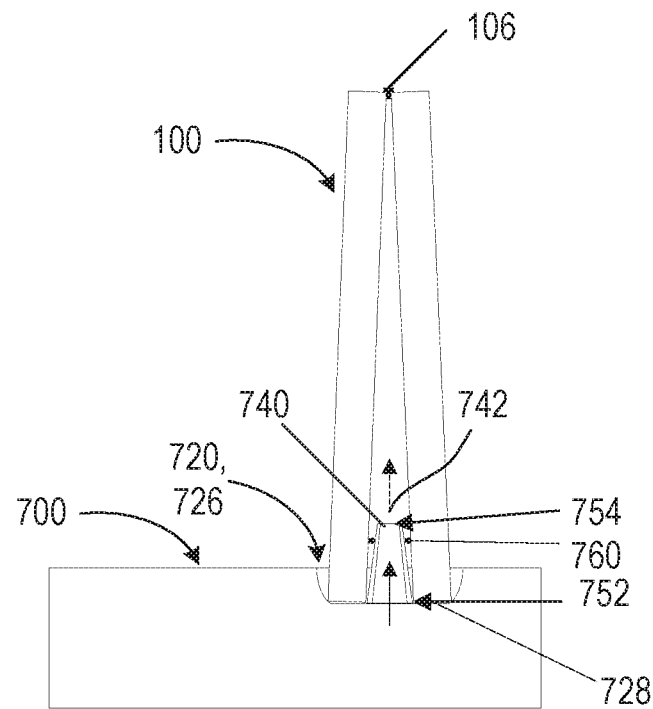
FIG. 7B is a general schematic of a cross-section along line A-A' of FIG. 7A, showing the foldable electronic device of FIGS. 1A and 1B positioned in a tent mode at an illustrative docking system having the engagement surface of FIG. 7A, in accordance with at least one example.

FIG. 7A is a top view schematic of another illustrative engagement surface 720, in accordance with at least one example. FIG. 7B is a general schematic of a cross-section along line A-A' of FIG. 7A, showing the foldable electronic device 100 of FIGS. 1A and 1B positioned on a docking system 700 in a tent mode orientation, in accordance with at least one example.

The example docking system of FIG. 7B includes the engagement surface 720 of FIG. 7A that is arranged to accept insertion of the foldable electronic device 100 in the tent mode, with a folded end 106 located distal from the docking system 700. In the example of FIG. 7B, a separator 750 may be wedge-shaped with the lower portion 752 of the separator 750 having a first width 753 (FIG. 7A) and the tip 754 of the separator 750 having a second width 755 (FIG. 7A). In the present example, the first width 753 may be wider than the second width 755 of the separator 750. Although in some examples, the second width 755 may be wider than the first width 753.

As shown in, FIG. 7B, a seal 760 may be provided along the separator 750. In the present example, the separator 750 may function both to provide a gap (e.g., like gap 451 of FIG. 4D), and to act as an airflow director. The seal 760 may be similar to the seal 460 and function in a similar manner to the example of FIGS. 4A-F, except that the seal 760 may be arranged along the separator 750, as opposed to (or in addition to) the perimeter as shown in FIG. 4A.

As shown in the combination of FIGS. 7A and 7B, the engagement surface 720 may be formed as a recess 726 to receive at least a portion of the foldable electronic device 100. The vent opening 740 may be disposed on the separator 750 that is provided in the form of an airflow director that extends from a base 728 of the engagement surface 720 into the recess 726.

Figure 8:
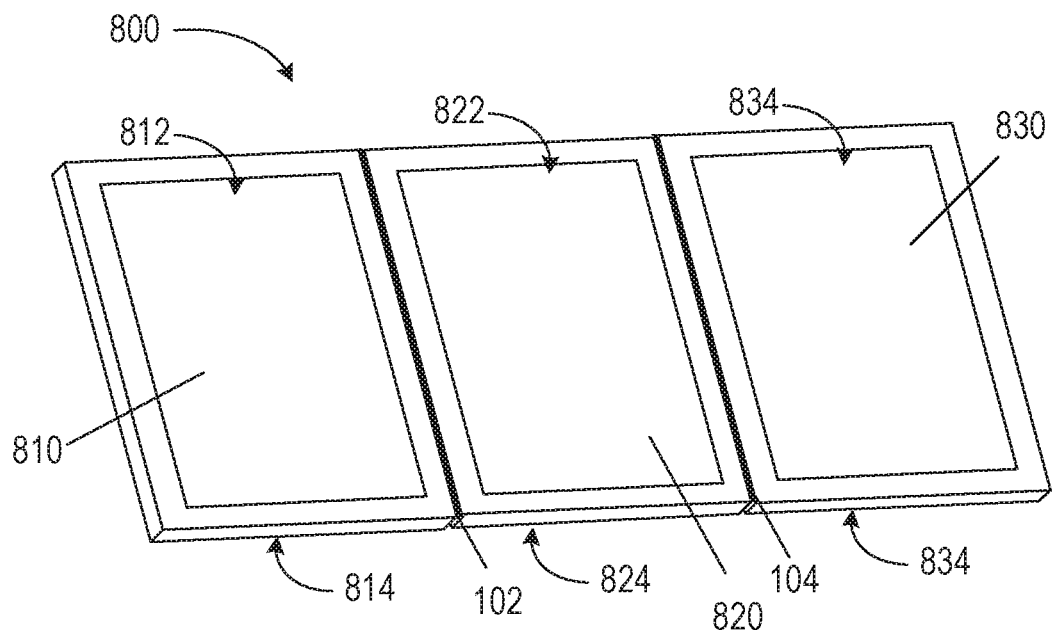
FIG. 8 is a perspective view of an example of an example tri-fold type foldable electronic device that may be used with illustrative docking systems disclosed herein. The foldable electronic device is depicted in a 180 degree open mode.

FIG. 8 is a perspective view of an example of a tri-fold foldable electronic device that may be used with illustrative docking systems disclosed herein. FIG. 8 shows the foldable electronic device is depicted in a 180 degree open mode with all three portions of the device arranged generally in side by side alignment with each other. The foldable electronic device 800 may include a plurality of portions including a first portion 810, a second portion 820 and a third portion 830 connected by fold portions 802 and 806. The foldable electronic device 800 may also include a first display surface 812, a second display surface 822 and third display surface 832. Opposite of the display surfaces may be first, second and third non-display surfaces 814, 824 and 834, as shown.

Figure 9:
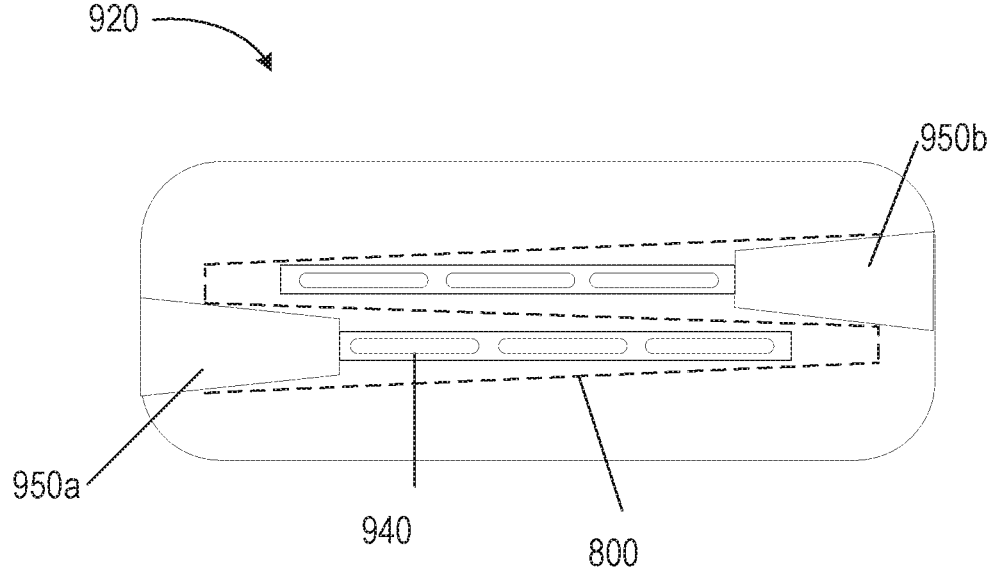
FIG. 9 is a top view schematic of an illustrative engagement surface showing an illustrative positioning for a foldable electronic device, in accordance with at least one example.

FIG. 9 is a top view schematic of an illustrative engagement surface 920 showing an illustrative positioning for a foldable electronic device, in accordance with at least one example. The engagement surfaces 920, 1020 and 1120 of the examples of FIGS. 9-11 may include the characteristics of the docking systems described previously, and FIGS. 4A-4F in particular. The examples of FIGS. 9-11 include additional features that may be particularly well suited to being used with the tri-fold electronic device shown in FIG. 8. For example, each of the examples of FIGS. 9, 10 and 11 may include a second separator 950*b*, 1050*b* and 1150*b*, respectively. The second separator 950*b*, 1050*b*, 1150*b* may separate the second portion 820 and a third portion 830 of the plurality of portions when the foldable electronic device 800 is operably engaged with any of the engagement surfaces 920, 1020 and 1120.

As shown in FIG. 9, the foldable electronic device 800 may be positioned at the engagement surface 920 and routed in a zig-zag arrangement in relation to a first separator 950*a* and a second separator 950*b*. In some examples, and in the example shown, each separator 950*a*, 950*b* may have their own corresponding vent opening 940*a*, 940*b*, but in some examples, a centrally-located vent opening(s) may also be provided that may supply air in place of both vent openings 940*a*, 940*b*.

Figure 10:
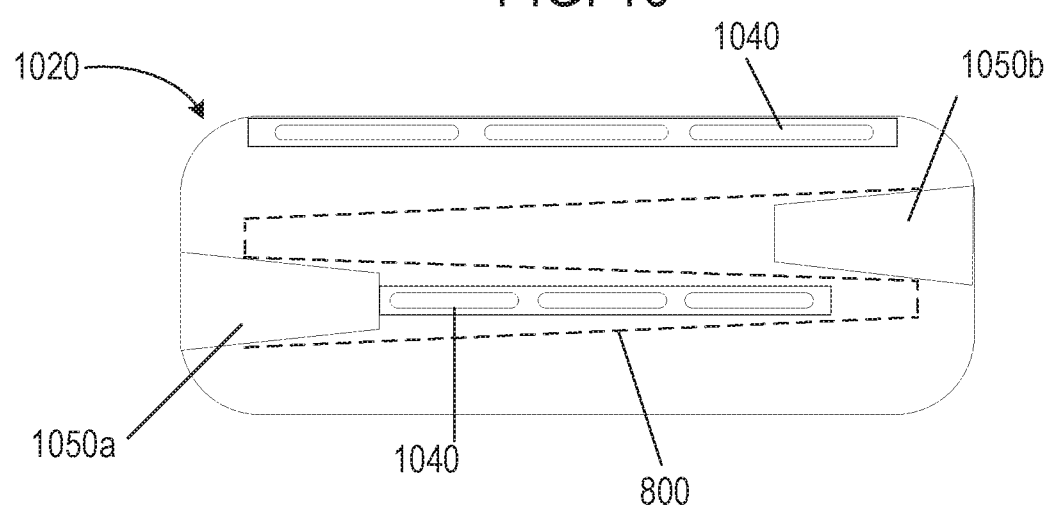
FIG. 10 is a top view schematic of a second illustrative engagement surface showing an illustrative positioning for a foldable electronic device, in accordance with at least one example.

FIG. 10 is a top view schematic of a surface 1020 showing an illustrative positioning for a foldable electronic device 800, in accordance with at least one example. In this example, the separators 1050*a* and 1050*b* are similar to the separators of FIG. 9. Additional vent opening 1040 are provided such that together the vent opening 1040 may be arranged to distribute airflow to all the non-display surfaces of the foldable electronic device 800.

Figure 11:
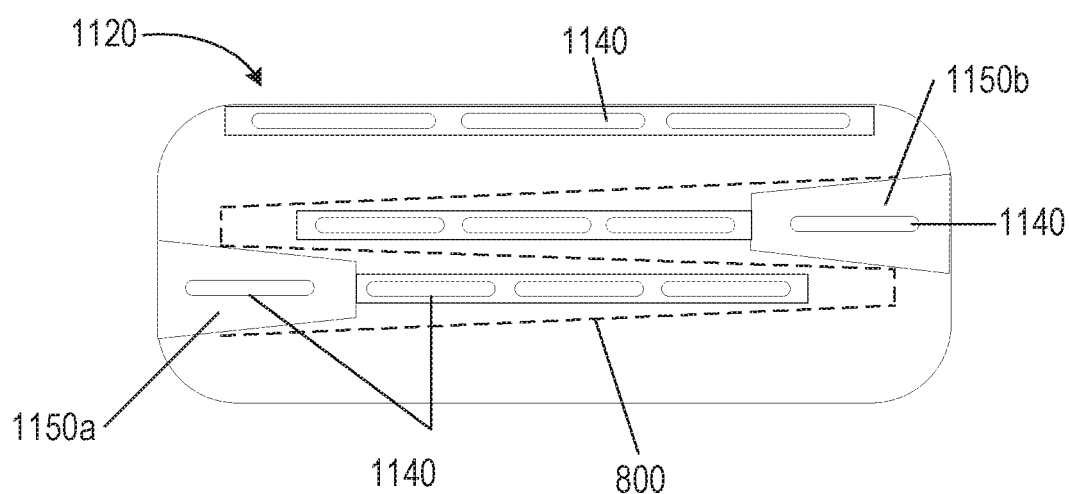
FIG. 11 is a top view schematic of a third illustrative engagement surface showing an illustrative positioning for a foldable electronic device, in accordance with at least one example.

FIG. 11 is a top view schematic of a third illustrative engagement surface 1120 showing an illustrative positioning for a foldable electronic device 800, in accordance with at least one example. FIG. 11 combines the separator and vent opening features of FIGS. 9 and 10, and further includes vent opening 1140 located in the separators 1150*a*, 1150*b*.

A docking system for a foldable electronic device according to any of the examples previously set forth may include: a means for receiving, at an engagement surface, at least a portion of the foldable electronic device in a standing book mode (FIGS. 4C-4F) or a tent mode (FIG. 7B). The docking systems may also include a means for separating and the means for separating maintains a separation space between a first portion and a second portion of the plurality of portions as described with respect to the examples set forth herein. The means for separating may be wedge-shaped. The means for separating may maintain a separation space between the first portion and the second portion of the foldable electronic device in a range between 0.5 degrees and 30 degrees apart, or create a gap of 1 mm and 50 mm apart, as well as other ranges described herein. To provide the beneficial cooling while maintaining the appearance of the device being in the tablet mode, a range of 0.5 degrees and 5 degrees, or 1 mm-5 mm apart may be preferred. In some examples a gap at the non-folded end between 1.5 mm and 5 mm may be preferred.

In further detail, the means for receiving may receive the foldable electronic device in a range between 330 and 359 degrees open. To give a more tablet-like appearance, a range between 340 and 359 degrees open may be used. In some examples, 355 degrees and 359 degrees open may represent a more preferred range.

The means for receiving may be configured to receive the foldable electronic device in a mostly open mode, in a range in between 85 percent and 99 percent open relative to a completely closed orientation, and more preferably between 95 percent and 99 percent open.

Cooling may be provided to the foldable electronic device by a means for blowing air into the separation space between the first portion and the second portion.

The means for separating may maintain the separation space such that a separation distance between two surfaces of the foldable electronic device at a first end portion of the engagement surface in a range between 1 mm and 50 mm, or more preferably between 1 mm and 20 mm, and most preferably be in a range between 1 mm and 10 mm. To provide the beneficial cooling while maintaining the appearance of the device being in the tablet mode, a range 1 mm-5 mm apart may be preferred. In some example, a gap at the non-folded end between 2 mm and 5 mm may be preferred to give the appearance that the tablet is closed while allowing suitable airflow.

FIG. 12 is a flow chart illustrating a method 1200 of cooling a foldable electronic device with a docking system. The foldable electronic device may be the foldable electronic device 100 of FIGS. 1A and 1B, or the foldable electronic device 800 of FIG. 8. The docking systems used with the method may be any of FIGS. 3, 4A-4F, 5, 6, 7A-7B and 9-11.

The method 1200 of cooling the foldable electronic device, may include cooling a foldable electronic device that has a plurality of portions that are foldable with respect to each other.

Operation 1202 of cooling the foldable electronic device may include receiving, at an engagement surface, the foldable electronic device. The foldable electronic device having at least a first portion and a second portion as shown and described with reference to FIGS. 1A and 1B.

In an example of the receiving operation 1202, the foldable electronic device being received includes two display surfaces and two non-display surfaces. Operation 1202 may include receiving the two non-display surfaces of the foldable electronic device in a generally open mode tablet mode where the two non-display surfaces generally face and oppose each other, and the two display surfaces generally face away from each other, and wherein the non-display surfaces are sandwiched in between the two display surfaces.

In some examples of the receiving operation 1202, receiving the foldable electronic device may include receiving the foldable electronic device in a mostly open tablet mode, in a range in between 85 percent open and 99 percent open. In some examples, receiving the foldable electronic device may include receiving the foldable electronic device in a range between 350 degrees and 359.5 degrees open.

In addition to receiving the foldable electronic device, operation 1204 may include maintaining a separation space between the first portion and the second portion received at the engagement surface. In some examples of operation 1204, maintain the separation space may be accomplished by a separator, such as a wedge-shaped separator. Maintaining the separation space may include maintaining a separation space between the two non-display surfaces of the foldable electronic device that are generally facing each other.

In some examples, maintaining the separation space may include maintaining two surfaces of the foldable electronic device apart in a range between 0.5 degrees and 5 degrees apart. In some examples, maintaining the separation space may include maintaining a separation distance between two surfaces of the foldable electronic device at a first end portion of the engagement surface, wherein the separation distance is in a range between 1 mm and 50 mm, and other ranges described herein.

Operation 1206 may include receiving presence information that the foldable electronic device is at the engagement surface. The presence information may be determined by a presence sensor, or by an input from the user, such as turning on a power switch. In some examples the presence information could be determined by the foldable electronic device being operably coupled to an electrical connector of the docking system (e.g., 490, FIG. 4A or 4B).

In response to receiving presence information that the foldable electronic device is at the engagement surface, operation 1208 may include blowing air into the separation space between the first portion and the second portion.

The docking systems shown and described with reference to FIGS. 3, 4A-F, 5-7 and 9-11 may be operated by at least one non-transitory machine-readable medium including instructions to operate, for example, one of the docking systems previously described, or any other suitable docking system. The docking system may be operated to cool a foldable electronic device having a plurality of portions that are foldable with respect to each other, such as the foldable electronic devices described with reference to FIGS. 1A, 1B and 8.

The docking system may include instructions, such as instructions stored on one or more memory, that when executed by a processor, may cause the processor to receive presence information regarding a presence of the foldable electronic device at an engagement surface.

As previously described in various examples of the docking system, the engagement surface may have a separator to maintain a separation space between a first portion and a second portion when the foldable electronic device is operably engaged with the engagement surface. The docking system may also include a vent opening that is arranged to direct airflow into the separation space to cool the foldable electronic device.

The instructions may, based on the presence information, operate a blower to blow air through the vent opening and into the separation space between the first portion and the second portion to provide cooling to the foldable electronic device.

In some examples, the instructions may cause the docking system to receive temperature information related to the foldable electronic device and, based on the temperature information, to control operation of the blower. The temperature information may be received from a sensor, such as but not limited to, a temperature sensor on the docking system or a temperature sensor on the electronic device. Temperature information may also be derived from performance information related to the foldable electronic device that may be used to provide an estimated temperature based on a correlation between temperature and performance.

In some examples, the instructions may further cause the docking system to receive blower information, and based on the blower information, to control operation of the blower. Blower information could include, for example, a temperature of the blower, a speed of the blower, current draw of the blower, or an overload alert regarding the blower.

In some examples the instructions may further cause the docking system to electrically connect the docking system to the foldable electronic device. For example, if the docking system includes an electrical connector (as shown in FIGS. 4A and 4B), when the foldable electronic device becomes operably coupled to the docking system, the instructions may cause the electrical connection to become operable and an exchange of data or power to occur, such as a charging the foldable electronic device or share data between the foldable electronic device and another computer that is also operably coupled to the docking system.

Various Notes and Examples

To better illustrate the method and apparatuses disclosed herein, a non-limiting list of embodiments is provided here.

Example 1 is a docking system for a foldable electronic device, the foldable electronic device having a plurality of portions that are foldable with respect to each other, the docking system comprising: a housing having an engagement surface to interface with a portion of the foldable electronic device when the foldable electronic device is operably engaged with the docking system, the engagement surface including: a vent opening arranged to direct airflow in between a first portion and a second portion of the plurality of portions when the foldable electronic device is operably engaged with the engagement surface; a separator to maintain separation between the first portion and the second portion when the foldable electronic device is operably engaged with the engagement surface; and a blower coupled to the housing to supply airflow through the vent opening.

In Example 2, the subject matter of Example 1 optionally includes wherein the separator is wedge shaped.

In Example 3, the subject matter of any one or more of Examples 1-2 optionally include wherein the engagement surface extends from a first end portion to a second end portion, and wherein the separator is located proximate the first end portion, and the vent opening is located in between the first end portion and the second end portion.

In Example 4, the subject matter of any one or more of Examples 1-3 optionally include wherein the separator comprises the vent opening.

In Example 5, the subject matter of any one or more of Examples 1-4 optionally include wherein the engagement surface has a first width at a first end portion and a second width at a second end portion, and wherein the first width is larger than at the second width.

In Example 6, the subject matter of any one or more of Examples 1-5 optionally includes wherein the engagement surface receives the foldable electronic device in a mostly open mode, in a range between 85-99 percent open.

In Example 7, the subject matter of any one or more of Examples 1-6 optionally include wherein the engagement surface is arranged to accept insertion of the foldable electronic device in a standing book mode.

In Example 8, the subject matter of any one or more of Examples 1-7 optionally include wherein the engagement surface is arranged to accept insertion of the foldable electronic device in a tent mode.

In Example 9, the subject matter of any one or more of Examples 1-8 optionally include wherein the separator is located in a recess of the engagement surface.

In Example 10, the subject matter of any one or more of Examples 1-9 optionally include wherein the separator comprises a separator vent opening.

In Example 11, the subject matter of any one or more of Examples 1-10 optionally include wherein the engagement surface further comprises a seal around at least a portion of a perimeter of the engagement surface.

In Example 12, the subject matter of any one or more of Examples 1-11 optionally include a second separator to separate the second portion and a third portion of the plurality of portions when the foldable electronic device is operably engaged with the engagement surface.

In Example 13, the subject matter of any one or more of Examples 1-12 optionally include wherein the engagement surface further comprises an electrical connector to operably couple the docking system to the foldable electronic device.

In Example 14, the subject matter of any one or more of Examples 1-13 optionally include the docking system further comprising a seal, and wherein the seal is arranged to re-direct stray airflow exiting the vent opening away from the perimeter and into a separation space between the plurality of portions of the foldable electronic device when the foldable electronic device is operably engaged with the engagement surface.

In Example 15, the subject matter of any one or more of Examples 1-14 optionally include wherein the vent opening directs airflow in a direction parallel to an axis of the foldable electronic device.

In Example 16, the subject matter of any one or more of Examples 1-15 optionally include wherein the vent opening directs airflow in a direction non-parallel to an axis of the foldable electronic device.

In Example 17, the subject matter of any one or more of Examples 1-16 optionally include wherein the separator has a first height at a separator first end portion and a second height at a separator second end portion, and wherein the first height and the second height are different.

In Example 18, the subject matter of any one or more of Examples 1-17 optionally include wherein the engagement surface extends from a first end portion to a second end portion, and wherein the engagement surface comprises a recess to accept insertion of at least a portion of the foldable electronic device.

In Example 19, the subject matter of any one or more of Examples 1-18 optionally include wherein the separator has a first thickness at a separator first end portion and a second thickness at a separator second end portion, and wherein the first thickness is larger than the second thickness.

In Example 20, the subject matter of any one or more of Examples 1-19 optionally include wherein the engagement surface has a first width at a first end portion and second width at a second end portion, and wherein the first width is larger than the second width, and wherein the separator first end portion is arranged proximate the first end portion of the engagement surface.

In Example 21, the subject matter of any one or more of Examples 1-20 optionally include wherein the engagement surface comprises a recess to accept insertion of at least a portion of the foldable electronic device, and wherein the vent opening is disposed on an airflow director that extends from a base of the engagement surface into the recess.

In Example 22, the subject matter of Example 21 optionally includes wherein the airflow director comprises a seal.

Example 23 is a method of docking a foldable electronic device, the foldable electronic device having a plurality of portions that are foldable with respect to each other, the method comprising: receiving, at an engagement surface, the foldable electronic device, wherein receiving the foldable electronic device having a plurality of portions includes maintaining a separation space between at least a first portion and a second portion of the plurality of portions; and blowing air into the separation space between the first portion and the second portion.

In Example 24, the subject matter of Example 23 optionally includes wherein maintaining the separation space between the first portion and the second portion is provided by a separator.

In Example 25, the subject matter of any one or more of Examples 23-24 optionally include wherein maintaining the separation space between the first portion and the second portion is provided by a wedge-shaped separator.

In Example 26, the subject matter of any one or more of Examples 23-25 optionally include wherein the foldable electronic device comprises two display surfaces and two non-display surfaces, and wherein receiving, at the engagement surface, the foldable electronic device, includes receiving the two non-display surfaces of the foldable electronic device in a generally open mode where the two non-display surfaces generally face and oppose each other, and the two display surfaces generally face away from each other, and wherein the non-display surfaces are sandwiched in between the two display surfaces.

In Example 27, the subject matter of any one or more of Examples 23-26 optionally include wherein maintaining the separation space comprises maintaining a separation space between two non-display surfaces of the foldable electronic device that are generally facing each other.

In Example 28, the subject matter of any one or more of Examples 23-27 optionally includes receiving the foldable electronic device in a mostly open mode, in a range between 85 and 99 percent open.

In Example 29, the subject matter of any one or more of Examples 23-28 optionally includes receiving the foldable electronic device in a mostly open mode, in a range between 330-359 degrees open.

In Example 30, the subject matter of any one or more of Examples 23-29 optionally includes wherein maintaining a separation distance between two surface of the foldable electronic device at a first end portion of the engagement surface, wherein the separation distance is in a range between 1 millimeter and 50 millimeters.

In Example 31, the subject matter of any one or more of Examples 23-30 optionally includes wherein maintaining the separation space comprises maintaining two surfaces of the foldable electronic device apparat in a range between 1 degree and 30 degrees apart.

Example 32 is at least one computer-readable medium comprising instructions to perform any of the methods of Examples 23-31.

Example 33 is a docking system comprising means for performing any of the methods of Examples 23-31.

Example 34 is a docking system for a foldable electronic device, the foldable electronic device having a plurality of portions that are foldable with respect to each other, the docking system comprising: means for receiving, at an engagement surface, at least a portion of the foldable electronic device; a means for separating, wherein the means for separating maintains a separation space between a first portion and a second portion of the plurality of portions; and means for blowing air into the separation space between the first portion and the second portion.

In Example 35, the subject matter of Example 34 optionally includes wherein the means for separating is wedge shaped.

In Example 36, the subject matter of any one or more of Examples 34-35 optionally includes wherein the means for separating maintains a separation between the first portion and the second portion of the foldable electronic device in a range between 1 degree and 30 degrees apart.

In Example 37, the subject matter of any one or more of Examples 34-36 optionally includes wherein the means for receiving is arranged to accept insertion of the foldable electronic device in a standing book mode.

In Example 38, the subject matter of any one or more of Examples 34-37 optionally includes wherein the means for receiving is arranged to accept insertion of the foldable electronic device in a tent mode.

In Example 39, the subject matter of any one or more of Examples 34-38 optionally includes wherein the means for receiving receives the foldable electronic device in a mostly open mode, in a range in between 85 percent open and 99 percent open.

In Example 40, the subject matter of any one or more of Examples 34-39 optionally includes wherein the means for receiving receives the foldable electronic device in a range between 330 degrees and 359 degrees open.

In Example 41, the subject matter of any one or more of Examples 34-40 optionally includes wherein the means for separating maintains the separation space such that a separation distance between two surfaces of the foldable electronic device at a first end portion of the engagement surface is in a range between 1 millimeter and 50 millimeters.

In Example 42, the subject matter of any one or more of Examples 34-41 optionally includes wherein maintaining the separation space maintains two surfaces of the foldable electronic device apart in a range between 1 degree and 30 degrees apart.

Example 43 is at least one machine-readable medium including instructions to operate a docking system for a foldable electronic device, the foldable electronic device having a plurality of portions that are foldable with respect to each other, and the instructions, when executed by a processor, cause the processor to: receive presence information regarding a presence of the foldable electronic device at an engagement surface, the engagement surface having a separator to maintain a separation space between a first portion and a second portion of the plurality of portions when the foldable electronic device is operably engaged with the engagement surface, and a vent opening that is arranged to direct airflow into the separation space; and operate a blower, based on the presence information, to blow air through the vent opening and into the separation space between the first portion and the second portion.

In Example 44, the subject matter of Example 43 optionally includes the instructions further causing the docking system to receive temperature information related to the foldable electronic device and, based on the temperature information, to control operation of the blower.

In Example 45, the subject matter of any one or more of Examples 43-44 optionally include the instructions further causing the docking system to receive blower information, and based on the blower information, to control operation of the blower.

In Example 46, the subject matter of any one or more of Examples 43-45 optionally include the instructions further causing the docking system to electrically connect to the foldable electronic device.

In Example 47, the subject matter of any one or more of Examples 43-46 optionally include the instructions further causing the docking system to charge the foldable electronic device.

In Example 48, the subject matter of any one or more of Examples 43-47 optionally include the instructions further causing the docking system to share data between the foldable electronic device and another computer that is operably coupled to the docking system.

The above detailed description includes references to the accompanying drawings, which form a part of the detailed description. Such examples may include elements in addition to those shown or described. However, examples in which only those elements shown or described are provided are also contemplated. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other examples may be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed example. Thus, the following claims are hereby incorporated into the Detailed Description as examples or examples, with each claim standing on its own as a separate example, and it is contemplated that such examples may be combined with each other in various combinations or permutations. The scope of the invention should be determined with reference to the appended claims, along with the full scope of equivalents to which such claims are entitled.

What is claimed is:

1. A docking system for a foldable electronic device, the foldable electronic device having a plurality of portions that are foldable with respect to each other, the docking system comprising:
    a housing having an engagement surface to interface with a portion of the foldable electronic device when the foldable electronic device is operably engaged with the docking system, the engagement surface including:
        a vent opening arranged to direct airflow in between a first portion and a second portion of the plurality of portions when the foldable electronic device is operably engaged with the engagement surface; and
        a separator configured to be disposed between the first portion and the second portion of the foldable electronic device to maintain a separation between the first portion and the second portion when the foldable electronic device is operably engaged with the engagement surface, wherein the separator maintains the separation allowing air flow from the vent opening through the separation between the first portion and the second portion; and
    a blower coupled to the housing to supply airflow through the vent opening.

2. The docking system of claim 1, wherein the separator is wedge shaped.

3. The docking system of claim 1, wherein the engagement surface extends from a first end portion to a second end portion, and wherein the separator is located proximate the first end portion, and the vent opening is located in between the first end portion and the second end portion.

4. The docking system of claim 1, wherein the separator comprises the vent opening.

5. The docking system of claim 1, wherein the engagement surface has a first width at a first end portion and a second width at a second end portion, and wherein the first width is larger than at the second width.

6. The docking system of claim 1, wherein the engagement surface receives the foldable electronic device in a mostly open mode, in a range in between 85 percent open and 99 percent open.

7. The docking system of claim 1, wherein the engagement surface is arranged to accept insertion of the foldable electronic device in a standing book mode.

8. The docking system of claim 1, wherein the engagement surface is arranged to accept insertion of the foldable electronic device in a tent mode.

9. The docking system of claim 1, wherein the separator is located in a recess of the engagement surface.

10. The docking system of claim 1, wherein the separator comprises a separator vent opening.

11. The docking system of claim 1, wherein the engagement surface further comprises a seal around at least a portion of a perimeter of the engagement surface.

12. The docking system of claim 1, further comprising a second separator to separate the second portion and a third portion of the plurality of portions when the foldable electronic device is operably engaged with the engagement surface.

13. The docking system of claim 1, wherein the engagement surface comprises a longitudinal recess that extends from a first end portion to a second end portion, wherein the separator and the vent opening are positioned in the recess, and wherein the separator is located proximate the first end portion, and the vent opening is located in between the first end portion and the second end portion.

14. The docking system of claim 13, wherein the longitudinal recess has a first width at a first end portion and a second width at a second end portion, wherein the first width is larger than the second width.

15. A method of docking a foldable electronic device, the foldable electronic device having a plurality of portions that are foldable with respect to each other, the method comprising:
receiving, at an engagement surface, the foldable electronic device, wherein receiving the foldable electronic device having a plurality of portions includes maintaining a separation space between at least a first portion and a second portion of the plurality of portions, wherein maintaining the separation space between the first portion and second portion includes disposing a separator between the first portion and the second portion of the foldable electronic device and allowing air flow from a vent opening through the separation space between the first portion and the second portion; and
blowing air into the separation space between the first portion and the second portion.

16. The method of claim 15, wherein maintaining the separation space between the first portion and the second portion is provided by the separator, and wherein the vent opening is located in the engagement surface.

17. The method of claim 15, wherein maintaining the separation space between the first portion and the second portion is provided by a wedge-shaped separator.

18. The method of claim 15, wherein the foldable electronic device comprises two display surfaces and two non-display surfaces, and wherein receiving, at the engagement surface, the foldable electronic device, includes receiving the two non-display surfaces of the foldable electronic device in a generally open mode where the two non-display surfaces generally face and oppose each other, and the two display surfaces generally face away from each other, and wherein the non-display surfaces are sandwiched in between the two display surfaces.

19. The method of claim 15, wherein maintaining the separation space comprises maintaining a separation space between two non-display surfaces of the foldable electronic device that are generally facing each other.

20. The method of claim 15, wherein receiving the foldable electronic device includes receiving the foldable electronic device in a mostly open mode, in a range in between 85 percent open and 99 percent open.

21. The method of claim 15, wherein receiving the foldable electronic device includes receiving the foldable electronic device in a range between 330 degrees and 359 degrees open.

22. The method of claim 15, wherein maintaining the separation space comprises maintaining a separation distance between two surfaces of the foldable electronic device at a first end portion of the engagement surface, wherein the separation distance is in a range between 1 millimeter and 50 millimeters.

23. The method of claim 15, wherein maintaining the separation space comprises maintaining two surfaces of the foldable electronic device apart in a range between 1 degree and 30 degrees apart.

24. At least one non-transitory machine-readable medium including instructions to operate a docking system for a foldable electronic device, the foldable electronic device having a plurality of portions that are foldable with respect to each other, and the instructions, when executed by a processor, cause the processor to:
receive presence information regarding a presence of the foldable electronic device at an engagement surface, the engagement surface having a separator to maintain a separation space between a first portion and a second portion of the plurality of portions when the foldable electronic device is operably engaged with the engagement surface, and a vent opening that is arranged to direct airflow into the separation space, wherein the separator maintains the separation allowing air flow from the vent opening through the separation space between the first portion and the second portion, wherein the separator is configured to be disposed between the first portion and the second portion of the foldable electronic device; and
operate a blower, based on the presence information, to blow air through the vent opening and into the separation space between the first portion and the second portion.

25. The at least one non-transitory machine-readable medium of claim 24, the instructions further causing the docking system to receive temperature information related to the foldable electronic device and, based on the temperature information, to control operation of the blower.

26. The at least one non-transitory machine-readable medium of claim 24, the instructions further causing the docking system to receive blower information, and based on the blower information, to control operation of the blower.

27. The at least one non-transitory machine-readable medium of claim 24, the instructions further causing the docking system to electrically connect to the foldable electronic device.

* * * * *